US012400991B2

(12) United States Patent
Choi

(10) Patent No.: US 12,400,991 B2
(45) Date of Patent: Aug. 26, 2025

(54) CLIP STRUCTURE FOR SEMICONDUCTOR PACKAGE AND SEMICONDUCTOR PACKAGE INCLUDING THE SAME

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 494 days.

(21) Appl. No.: 17/839,479

(22) Filed: Jun. 14, 2022

(65) Prior Publication Data
US 2022/0399300 A1 Dec. 15, 2022

(30) Foreign Application Priority Data
Jun. 14, 2021 (KR) .................. 10-2021-0076510

(51) Int. Cl.
*H01L 23/00* (2006.01)
*H01L 25/07* (2006.01)
*H01L 23/498* (2006.01)

(52) U.S. Cl.
CPC .............. *H01L 24/40* (2013.01); *H01L 24/32* (2013.01); *H01L 24/37* (2013.01); *H01L 24/73* (2013.01); *H01L 25/072* (2013.01); *H01L 25/074* (2013.01); *H01L 23/49833* (2013.01); *H01L 23/49844* (2013.01); *H01L 23/49861* (2013.01); *H01L 24/48* (2013.01); *H01L 2224/32225* (2013.01); *H01L 2224/37124* (2013.01); *H01L 2224/37147* (2013.01); *H01L 2224/4001* (2013.01); *H01L 2224/40091* (2013.01); *H01L 2224/40095* (2013.01); *H01L 2224/40137* (2013.01); *H01L 2224/40145* (2013.01); *H01L 2224/40225* (2013.01); *H01L 2224/40245* (2013.01); *H01L 2224/48225* (2013.01); *H01L 2224/73213* (2013.01); *H01L 2224/73215* (2013.01); *H01L 2224/73221* (2013.01); *H01L 2224/73263* (2013.01);
(Continued)

(58) Field of Classification Search
CPC ........................................................ H01L 24/40
USPC ............................................................ 257/786
See application file for complete search history.

(56) References Cited

U.S. PATENT DOCUMENTS

2014/0103510 A1* 4/2014 Andou .............. H01L 23/49551
257/676

FOREIGN PATENT DOCUMENTS

EP 0788155 A1 8/1997
EP 2916348 A1 * 9/2015 ........... B62D 5/0406
(Continued)

*Primary Examiner* — Ajay Arora
(74) *Attorney, Agent, or Firm* — Park, Kim & Suh, LLC

(57) ABSTRACT

Provided is a clip structure for a semiconductor package comprising: a first bonding unit bonded to a terminal part of an upper surface or a lower surface of a semiconductor device by using a conductive adhesive interposed therebetween, a main connecting unit which is extended and bent from the first bonding unit, a second bonding unit having an upper surface higher than the upper surface of the first bonding unit, an elastic unit elastically connected between the main connecting unit and one end of the second bonding unit, and a supporting unit bent and extended from the other end of the second bonding unit toward the main connecting unit, wherein the supporting unit is formed to incline at an angle of 1° through 179° from an extended surface of the main connecting unit and has an elastic structure so that push-stress applying to the semiconductor device while molding may be dispersed.

20 Claims, 13 Drawing Sheets

(a)

(b)

(52) U.S. Cl.
CPC ............... *H01L 2224/73265* (2013.01); *H01L 2924/15724* (2013.01); *H01L 2924/15747* (2013.01); *H01L 2924/15787* (2013.01); *H01L 2924/16196* (2013.01); *H01L 2924/16251* (2013.01); *H01L 2924/1632* (2013.01); *H01L 2924/165* (2013.01); *H01L 2924/182* (2013.01); *H01L 2924/3512* (2013.01); *H01L 2924/37001* (2013.01)

(56) References Cited

FOREIGN PATENT DOCUMENTS

| | | |
|---|---|---|
| JP | 2017-139304 A | 8/2017 |
| KR | 10-2001-0111736 A | 12/2001 |
| KR | 10-0867573 B1 | 11/2008 |
| KR | 10-2012-0128038 A | 11/2012 |
| KR | 10-1643332 B1 | 7/2016 |
| KR | 10-2196397 B1 | 12/2020 |

\* cited by examiner (a)

(b)

(a)

(b)

(a)

(b)

(a)

(b)

(a)

(b)

(a)

(b)

CLIP STRUCTURE FOR SEMICONDUCTOR PACKAGE AND SEMICONDUCTOR PACKAGE INCLUDING THE SAME

CROSS-REFERENCE TO RELATED PATENT APPLICATION

This application claims the benefit of Korean Patent Application No. 10-2021-0076510, filed on Jun. 14, 2021, in the Korean Intellectual Property Office, the disclosure of which is incorporated herein in its entirety by reference.

BACKGROUND OF THE INVENTION

Field of the Invention

The present invention relates to a clip structure for a semiconductor package and a semiconductor package including the same, wherein the clip structure, which is used instead of a high-priced metal spacer having a vertical structure formed of a material similar with a Coefficient of Thermal Expansion (CTE) of a semiconductor device so as to have price competitiveness, is bent having elasticity, and has a non-vertical structure, may disperse or absorb push-stress generated while molding so as to protect a semiconductor device and to effectively prevent a crack of an adhesive on a bonding area interposed between the semiconductor device and the clip structure.

Description of the Related Art

In general, a semiconductor package includes a semiconductor chip installed on a lower substrate or an upper substrate, a conductor which is a metal post functioning as a spacer bonded on the semiconductor chip, a lead frame formed of Cu for applying an external electrical signal, and a package housing molded with a sealing member. Here, the semiconductor chip is bonded on a pad of the lead frame, and a plating layer formed of Ag is formed on a lead of the lead frame, wherein the plating layer is electrically connected to a pad of the semiconductor chip using a bonding wire which is a signal line.

For example, as illustrated in FIG. 1A, in a general semiconductor package, a semiconductor chip 14 is bonded on a lower metal insulating substrate 11A using a first bonding unit 12 interposed therebetween, a hexahedral or cylindrical conductor 17 having a vertical structure which is a metal spacer is bonded on the semiconductor chip 14 using a second bonding unit 16 interposed therebetween and is bonded on an upper metal insulating substrate 11B using a third bonding unit 13 interposed therebetween, and a metal bridge 18 having a vertical structure is formed for electrical connection between the lower metal insulating substrate 11A and the metal insulating substrate 11B.

The semiconductor chip is bonded to the substrate and the conductor by respectively using a solder interposed therebetween, however, a crack is generated in the first bonding unit 12 or the second bonding unit 16, as illustrated in FIG. 1B, due to a difference of a Coefficient of Thermal Expansion (CTE) between the substrates 11A and 11B, the conductor 17, and the first and second bonding units 12 and 16 and thereby, a reliability issue may occur.

The main cause of the crack generated due to a CTE difference is direct impact on the semiconductor chip occurring after the metal spacer bonded on the semiconductor chip is directly and vertically bonded to the upper metal insulating substrate and thereby, a mold pressurizes the upper metal insulating substrate and the metal spacer during molding for forming a package housing. Accordingly, a yield of a product is lowered.

In order to minimize a CTE difference with the semiconductor chip, the metal spacer or instead of a metal post, a material similar with a CTE of the semiconductor chip may be used, however, are considerably expensive compared with an existing metal spacer or metal post. Therefore, price competitiveness of a product is lowered.

SUMMARY OF THE INVENTION

The present invention provides a clip structure for a semiconductor package and a semiconductor package including the same, wherein the clip structure, which is used instead of a high-priced metal spacer having a vertical structure formed of a material similar with a Coefficient of Thermal Expansion (CTE) of a semiconductor device so as to have price competitiveness, is bent having elasticity, and has a non-vertical structure, may disperse or absorb push-stress generated while molding so as to protect a semiconductor device and to effectively prevent a crack of an adhesive on a bonding area interposed between the semiconductor device and the clip structure.

According to an aspect of the present invention, there is provided a clip structure for a semiconductor package including: a first bonding unit bonded to a terminal part of an upper surface or a lower surface of a semiconductor device by using a conductive adhesive interposed therebetween; a main connecting unit which is extended and bent from the first bonding unit; a second bonding unit having an upper surface higher than the upper surface of the first bonding unit; an elastic unit elastically connected between the main connecting unit and one end of the second bonding unit; and a supporting unit bent and extended from the other end of the second bonding unit toward the main connecting unit, wherein the supporting unit is formed to incline at an angle of 1° through 179° from an extended surface of the main connecting unit.

The end of the supporting unit and the main connecting unit may be structurally contacted with each other.

The end of the supporting unit and the main connecting unit may be spaced apart from each other by a distance of 0.1 μm through 2 mm.

The clip structure may be formed of a single material including Cu or Al or a composite material containing 50% or more of Cu or Al and have a thickness of 0.1 mm through 2 mm.

The elastic unit may have a circular form.

According to another aspect of the present invention, there is provided a, semiconductor package including: at least one first substrate; at least one second substrate spaced apart from the first substrate; at least one semiconductor device installed on the first substrate or the second substrate; a clip structure including: a first bonding unit bonded to a terminal part of an upper surface or a lower surface of the semiconductor device by using a conductive adhesive interposed therebetween, a main connecting unit which is extended and bent from the first bonding unit, a second bonding unit having an upper surface higher than the upper surface of the first bonding unit, an elastic unit elastically connected between the main connecting unit and one end of the second bonding unit, and a supporting unit bent and extended from the other end of the second bonding unit toward the main connecting unit, wherein the supporting unit is formed to incline at an angle of 1° through 179° from an extended surface of the main connecting unit; a package housing covering the semiconductor device; and at least one terminal exposed to the outside of the package housing for electrically connecting to the semiconductor device, wherein the second bonding unit of the clip structure is bonded to the second substrate, the first substrate, or the first and second substrates by using a conductive adhesive or a non-conductive adhesive.

According to another aspect of the present invention, there is provided a semiconductor package including: at least one first substrate including at least one first semiconductor device installed thereon; at least one second substrate which is spaced apart from the first substrate, the at least one second substrate including at least one second semiconductor device installed thereon; a clip structure including: a first bonding unit bonded to a terminal part of an upper surface or a lower surface of the first semiconductor device by using a conductive adhesive interposed therebetween, a main connecting unit which is extended and bent from the first bonding unit, a second bonding unit having an upper surface higher than the upper surface of the first bonding unit, an elastic unit elastically connected between the main connecting unit and one end of the second bonding unit, and a supporting unit bent and extended from the other end of the second bonding unit toward the main connecting unit, wherein the supporting unit is formed to incline at an angle of 1° through 179° from an extended surface of the main connecting unit; a package housing covering the first semiconductor device and the second semiconductor device; and at least one terminal exposed to the outside of the package housing for electrically connecting to the first semiconductor device or the second semiconductor device, wherein the second bonding unit of the clip structure is bonded to a terminal part of the upper surface or the lower surface of the second semiconductor device by using a conductive adhesive.

According to another aspect of the present invention, there is provided a semiconductor package including: at least one substrate; at least one semiconductor device installed on the substrate; a clip structure including: a first bonding unit bonded to a terminal part of an upper surface or a lower surface of the semiconductor device by using a conductive adhesive interposed therebetween, a main connecting unit which is extended and bent from the first bonding unit, a second bonding unit having an upper surface higher than the upper surface of the first bonding unit, an elastic unit elastically connected between the main connecting unit and one end of the second bonding unit, and a supporting unit bent and extended from the other end of the second bonding unit toward the main connecting unit, wherein the supporting unit is formed to incline at an angle of 1° through 179° from an extended surface of the main connecting unit; a package housing covering the semiconductor device; and at least one terminal exposed to the outside of the package housing for electrically connecting to the semiconductor device, wherein at least a part of the upper surface of the second bonding unit in the clip structure is exposed to the surface of the package housing.

The end of the supporting unit and the main connecting unit in the clip structure may be structurally contacted with each other.

The end of the supporting unit and the main connecting unit in the clip structure may be spaced apart from each other by a distance of 0.1 µm through 2 mm.

The clip structure may be formed of a single material comprising Cu or Al or a composite material containing 50% or more of Cu or Al and have a thickness of 0.1 mm through 2 mm.

The elastic unit may have a circular form.

The thickness of the clip structure may be smaller than the thickness of the first substrate or the second substrate.

The substrate, the first substrate, or the second substrate may include at least one insulating layer.

The substrate, the first substrate, or the second substrate may be formed of a single material including Cu or Al or a composite material containing 50% or more of Cu or Al.

At least a part of the second bonding unit exposed from the surface of the package housing may be bonded to a heat sink through a heat transmitting unit.

The heat transmitting unit may have heat transfer rate of 0.1 w/mk through 15 w/m.

The heat transmitting unit may be a conductor.

A part of the substrate, the first substrate, or the second substrate may be exposed from the surface of the package housing.

The semiconductor package described above may be used in driving an inverter, a converter, or an On Board Charger (OBC).

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
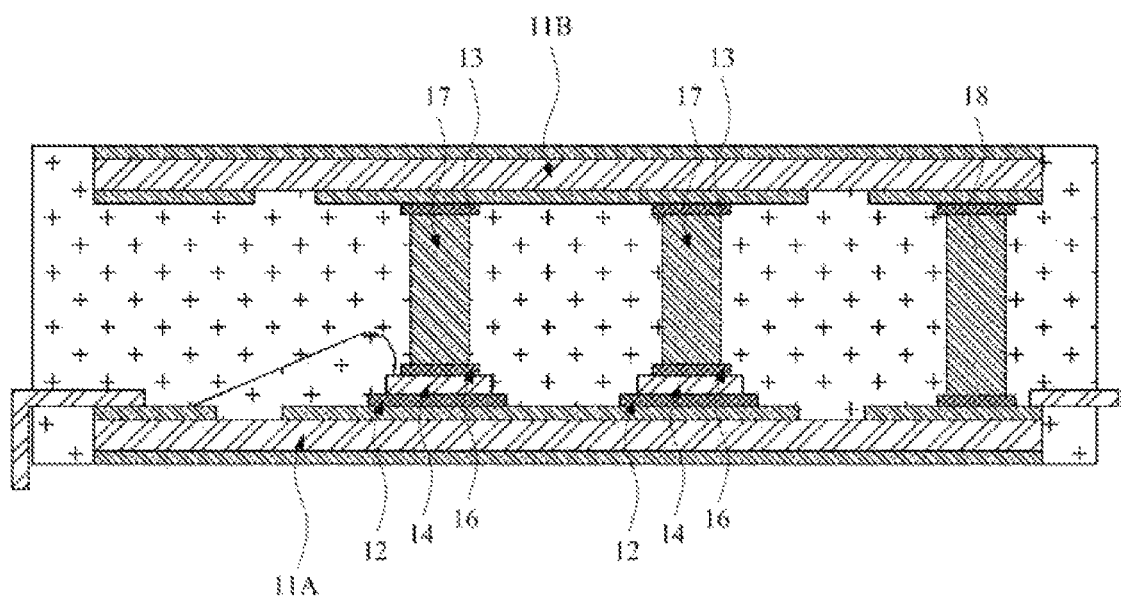
FIG. 1 is a general semiconductor package.
Figure 1:
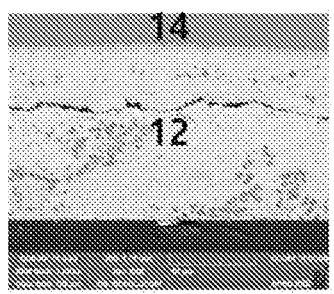
Figure 1:
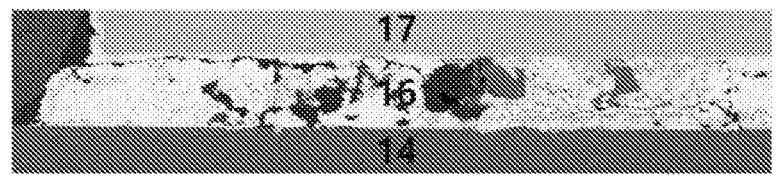

Hereinafter, embodiments of the present invention will be described in more detail with reference to accompanying drawings.

A clip structure for a semiconductor package 110 according to a first embodiment of the present invention includes a first bonding unit 111 bonded to a terminal part of an upper surface or a lower surface of a semiconductor device 120 by using a conductive adhesive 110a interposed therebetween, a main connecting unit 112 which is extended and bent from the first bonding unit 111, a second bonding unit 113 having an upper surface higher than the upper surface of the first bonding unit 111, an elastic unit 114 elastically connected between the main connecting unit 112 and one end of the second bonding unit 113, and a supporting unit 115 bent and extended from the other end of the second bonding unit 113 toward the main connecting unit 112, wherein the supporting unit 115 is formed to incline at an angle of 1° through 179° from an extended surface of the main connecting unit 112 and has an elastic structure so that push-stress applying to the semiconductor device while molding may be dispersed.

Figure 2:
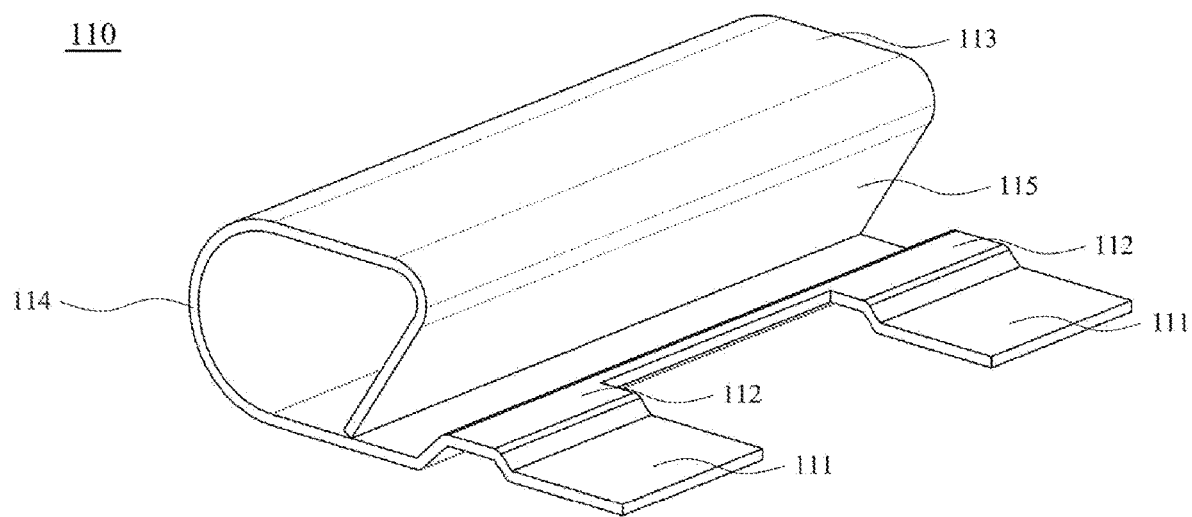
FIG. 2 is a perspective view of a clip structure for a semiconductor package according to a first embodiment of the present invention.
Figure 3:
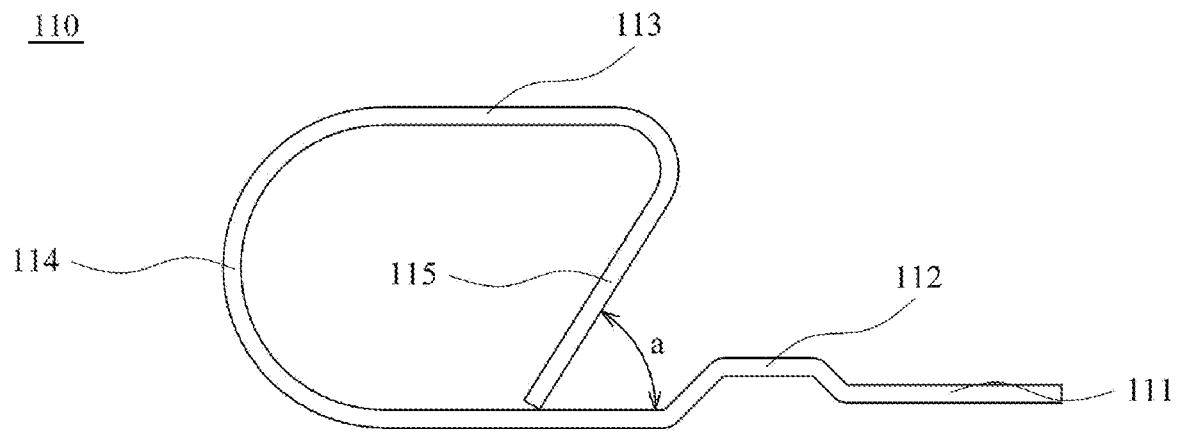
FIG. 3 is a cross-sectional view of the clip structure for a semiconductor package of FIG. 2.
Figure 3:
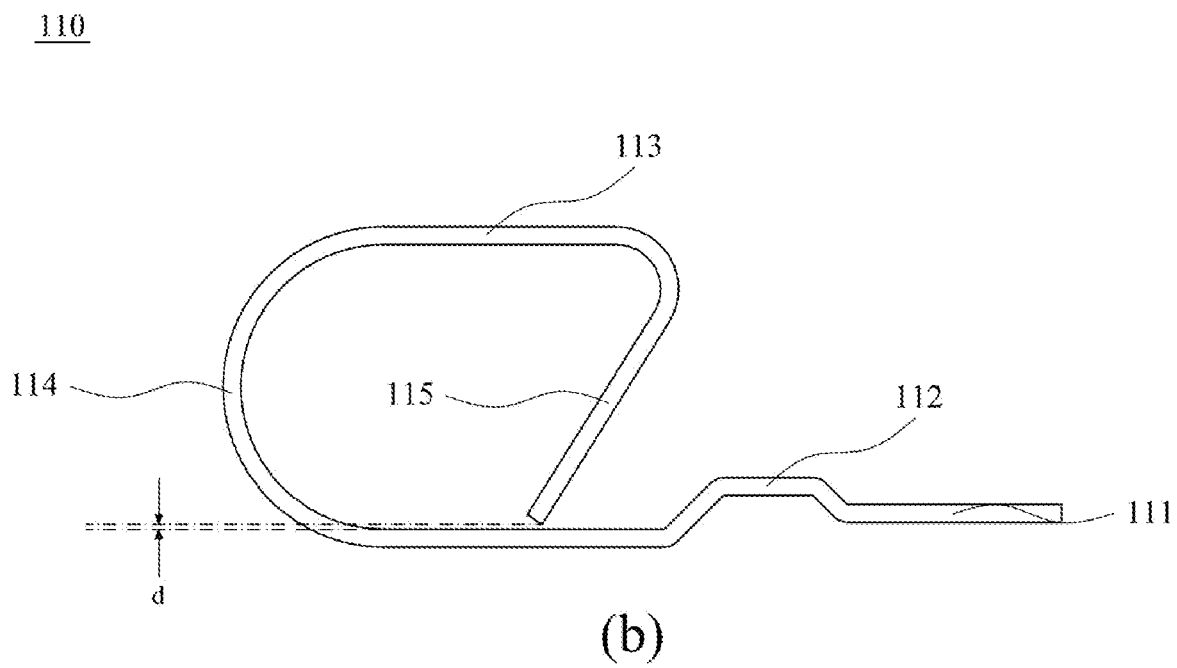

Hereinafter, the clip structure for a semiconductor package 110 mentioned above will be described in more detail with reference to FIGS. 2 and 3.

The clip structure 110 according to the present embodiment is bent in a specific form and thus, is elastic so that the clip structure 110 is bonded and electrically connected to the semiconductor device 120 and functions as a spacer which keeps a vertical bonding distance between a first substrate 130 and a second substrate 140. Here, when the first substrate 130, the second substrate 140, and the semiconductor device 120 are molded, push-stress applied toward a vertical direction by a mold (not illustrated) may be dispersed to transmit the minimum impact on the semiconductor device 120. Accordingly, the durability of the semiconductor device 120 may be improved.

That is, the clip structure 110 may be classified by its structure and function and include the first bonding unit 111, the main connecting unit 112, the second bonding unit 113, the elastic unit 114, and the supporting unit 115.

More specifically, the clip structure 110 may include the planar type first bonding unit 111, the main connecting unit 112, the second bonding unit 113, the elastic unit 114, and the supporting unit 115, wherein the first bonding unit 111 is bonded to the electrical terminal part of the upper surface (when installed on the first substrate 130) or the lower surface (when installed on the second substrate 140) of the semiconductor device 120 installed on the first substrate 130 or the second substrate 140 by using the conductive adhesive 110a interposed therebetween, the main connecting unit 112 is extended and bent from the first bonding unit 111 to absorb the push-stress, the second bonding unit 113 has the upper surface higher than the upper surface of the first bonding unit 111 to bond to the second substrate 140 or to be exposed to the surface of the package housing 150, the elastic unit 114 is elastically connected between the main connecting unit 112 and one end of the second bonding unit 113 to absorb the push-stress, and the supporting unit 115 is bent downwards and extended from the other end of the second bonding unit 113 toward the main connecting unit 112.

As described above, the push-stress applied while molding for forming the package housing 150 is absorbed and dispersed left and right or upward and downward by using the elastic unit 114 elastically connected to the bent main connecting unit 112. Accordingly, the semiconductor device 120 may be blocked from being directly impacted and thus, may have improved durability.

In particular, the elastic unit 114 may have a circular form between the main connecting unit 112 and the second bonding unit 113 and thereby, the push-stress may be effectively dispersed in a vertical direction.

Here, referring to FIG. 3A, the supporting unit 115 is formed to incline at an angle a of 1° through 179° from the extended surface of the main connecting unit 112, and the push-stress applied in a vertical direction may be absorbed. Accordingly, the push-stress may not be directly transmitted to the semiconductor device 120.

Selectively, the end of the supporting unit 115 and the main connecting unit 112 may be structurally contacted with each other or may be spaced apart from each other by a distance d of 0.1 μm through 2 mm, as illustrated in FIGS. 3A and 3B, according to a single sided substrate, a two-sided substrate, a material of the clip structure 110, the semiconductor device, or a material of molding.

In addition, the clip structure 110 may be generally formed of a single material including Cu or Al or a composite material containing 50% or more of Cu or Al and may have a thickness of 0.1 mm through 2 mm. Accordingly, the clip structure 110 may have excellent ductility and malleability and thus, may effectively absorb the push-stress.

Hereinafter, semiconductor packages including the clip structure 110 described above will be described in more detail according to a substrate structure in the second through fourth embodiments.

The semiconductor package according to the second embodiment of the present invention includes the first substrate 130, the second substrate 140, and the semiconductor device 120 contacting the first bonding unit 111. The semiconductor package according to the third embodiment of the present invention includes the first substrate 130, the second substrate 140, and the semiconductor device 120 respectively contacting the first bonding unit 111 and the second bonding unit 113. The semiconductor package according to the fourth embodiment of the present invention includes the single substrate 130, the second bonding unit 113 exposed to the surface of the package housing 150, and the semiconductor device 120 contacting the first bonding unit 111 or the main connecting unit 112.

Hereinafter, the semiconductor package according to the second embodiment of the present invention will be described in more detail below with reference to FIGS. 4 and 5.

Firstly, at least one semiconductor device 120 is installed on at least one first substrate 130, wherein the first substrate 130 may be a lower substrate having a specific metal pattern allowing electrical connection.

Next, at least one second substrate 140 is spaced apart from the first substrate 130 and may be an upper substrate having a specific metal pattern allowing electrical connection. As illustrated in FIG. 4, the semiconductor device 120 may not be installed on the second substrate 140 and as illustrated in FIG. 5, the semiconductor device 120 may be installed on the second substrate 140.

Here, the first substrate 130 or the second substrate 140 may include at least one insulating layer including $Al_2O_3$ (ceramic) or AlN.

Also, the first substrate 130 or the second substrate 140 may be formed of a metal material or an insulating material.

In addition, the first substrate 130 or the second substrate 140 may have a stack structure each including at least one metal layer 131 and 141, at least one insulating layer 132 and 142 including $Al_2O_3$ (ceramic) or AlN, and at least one metal layer 133 and 143, wherein each metal layer may have a thickness of 15 μm through 2 mm and may be a single metal layer, an alloy metal layer, or a plated metal layer.

The at least one semiconductor device 120 is installed on the first substrate 130 or the second substrate 140, and one end thereof is bonded to the first substrate 130 (refer to FIG. 4) or the first and second substrates 130 and 140 (refer to FIG. 5) by using a conductive adhesive 121 interposed therebetween.

The semiconductor device 120 is a power semiconductor chip such as an Insulated Gate Bipolar Transistor (IGBT), a diode, a Metal-Oxide-Semiconductor Field-Effect Transistor (MOSFET), or a Junction Field Effect Transistor (JFET) and may be used in driving of an inverter, a converter, or an On Board Charger (OBC) which converts or controls power.

Next, the clip structure for a semiconductor package 110 is mentioned above, and as illustrated in FIGS. 2 through 5, the clip structure 110 includes the first bonding unit 111 bonded to the terminal part of the upper surface or the lower surface of the semiconductor device 120 by using the conductive adhesive 110*a* interposed therebetween, the main connecting unit 112 which is extended and bent from the first bonding unit 111, the second bonding unit 113 having the upper surface higher than the upper surface of the first bonding unit 111, the elastic unit 114 elastically connected between the main connecting unit 112 and one end of the second bonding unit 113, and the supporting unit 115 bent and extended from the other end of the second bonding unit 113 toward the main connecting unit 112, wherein the supporting unit 115 is formed to incline at an angle of 1° through 179° from the extended surface of the main connecting unit 112. Accordingly, the push-stress may be dispersed or absorbed and thereby, the impact which may be directly transmitted to the semiconductor device 120 may be relieved.

Here, the second bonding unit 113 of the clip structure 110 may be bonded to the second substrate 140, the first substrate 130, or the first and second substrates 130 and 140 by using a conductive adhesive 110*b* or a non-conductive adhesive 110*b* interposed therebetween.

Figure 4:
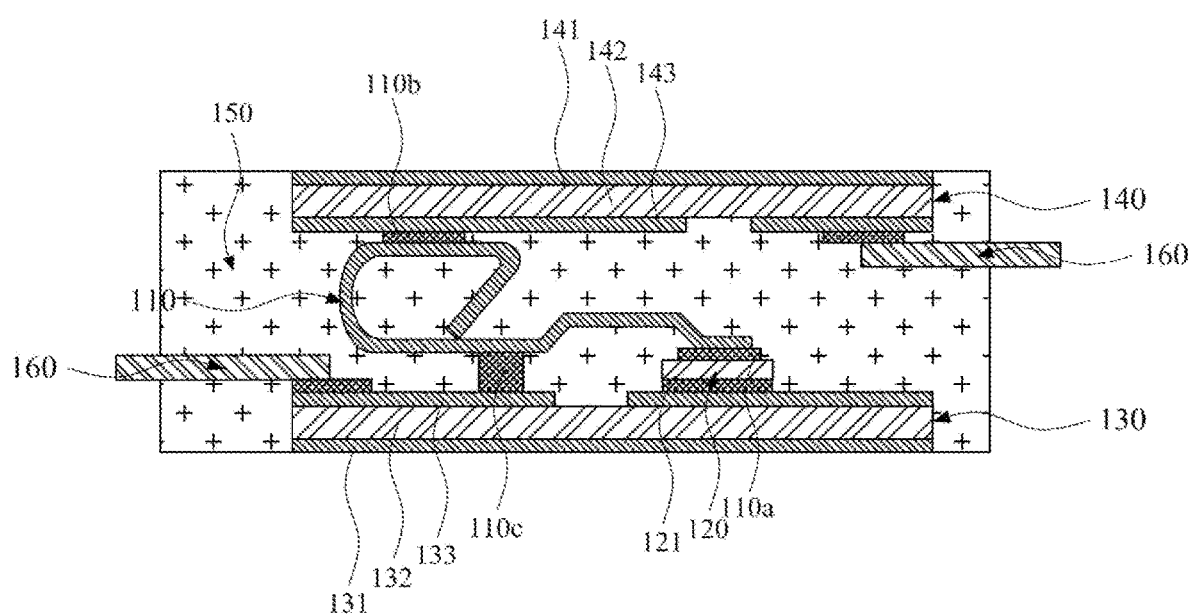
FIGS. 4 and 5 are cross-sectional views of a semiconductor package according to a second embodiment of the present invention.
Figure 5:
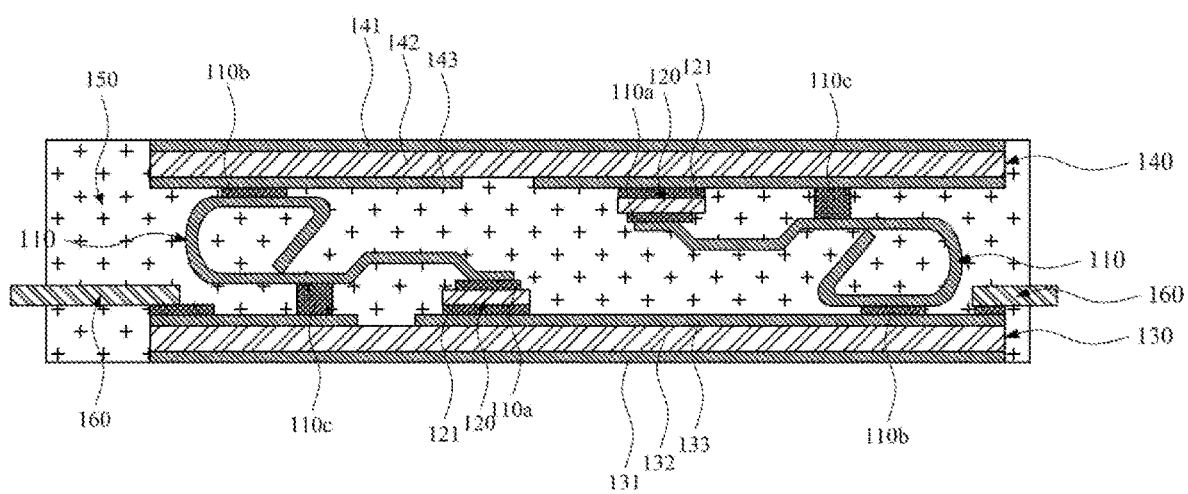

As illustrated in FIG. 4, the single clip structure 110 may be formed between the first substrate 130 and the second substrate 140 and as illustrated in FIG. 5, at least a pair of the single clip structure 110 may be formed and spaced apart from each other between the first substrate 130 and the second substrate 140 in a vertically reversed structure.

Also, the main connecting unit 112 may be bonded to the first substrate 130 or the second substrate 140 by using a separate adhesive 110*c*.

Figure 7:
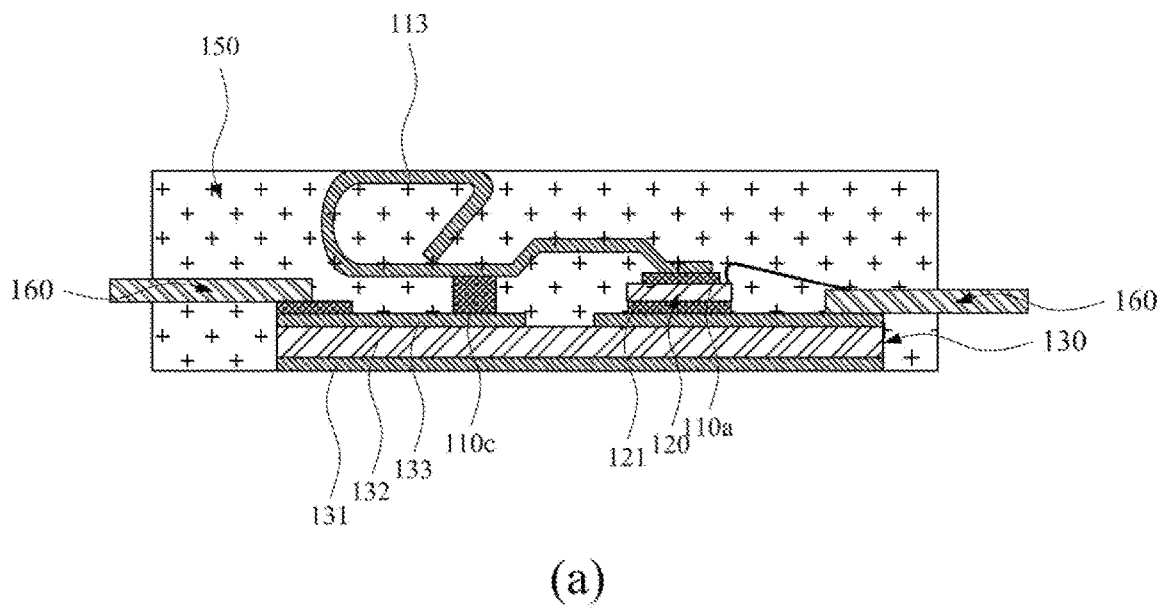
FIG. 7 is a cross-sectional view of a semiconductor package according to a fourth embodiment of the present invention.
Figure 7:
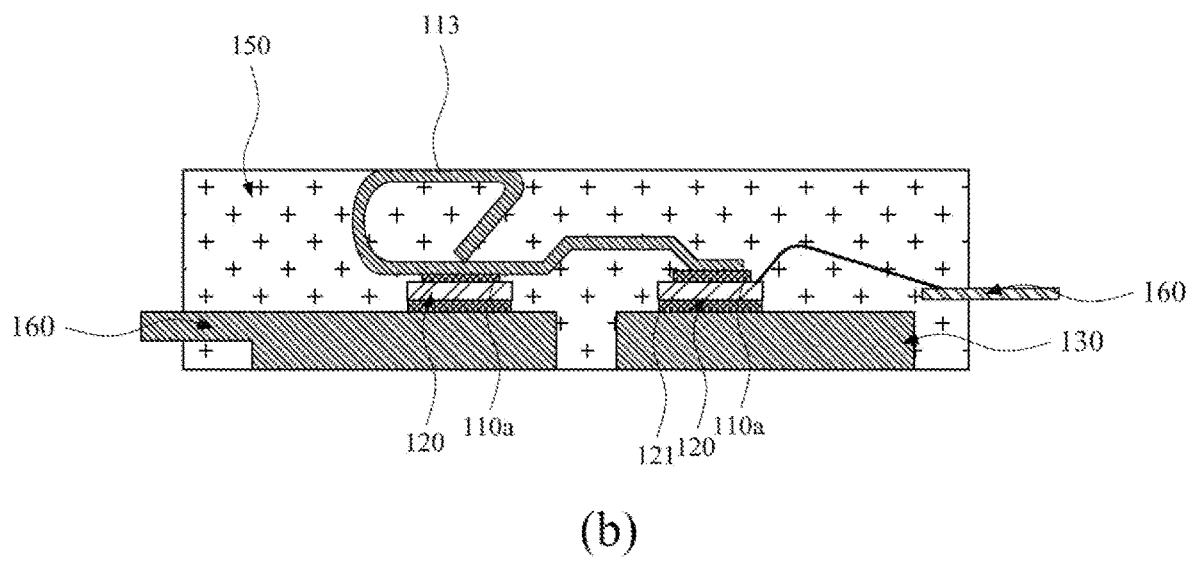
Figure 8:
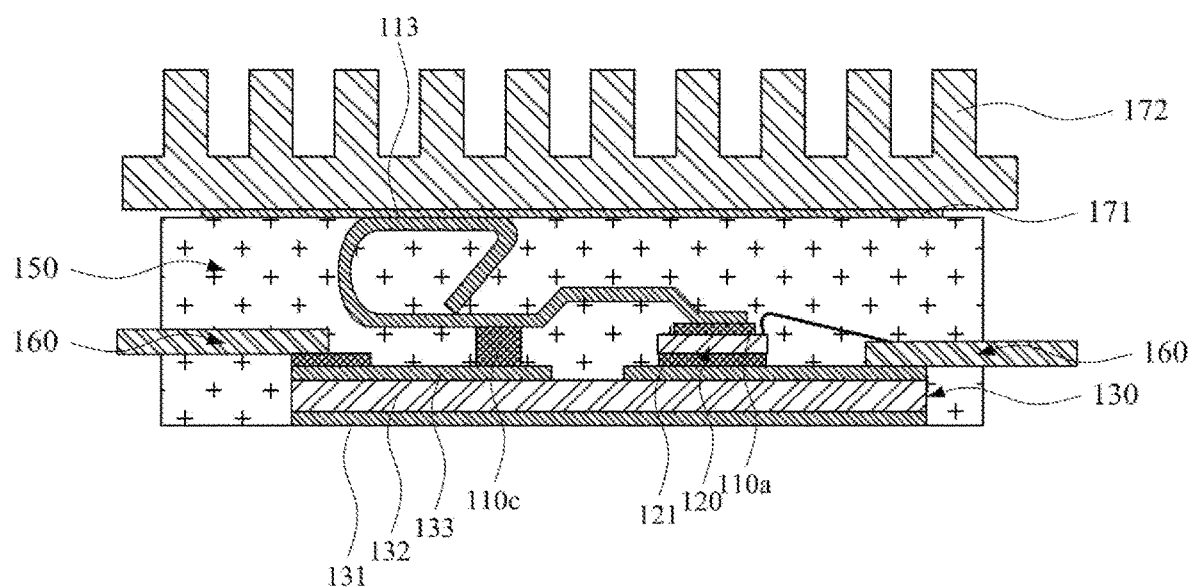
FIG. 8 illustrates a heat radiation structure of the semiconductor package according to the fourth embodiment of FIG. 7.

A conductive connecting member (not illustrated) such as a bonding wire or a clip electrically connects the semiconductor device 120 to a terminal 160 extended to the outside of the package housing 150 and thus, an electrical signal may be applied (refer to FIGS. 7 and 8).

The package housing 150 is formed of EMC, PBT, or PPS, insulates, and covers to protect an internal circuit, for example, the clip structure 110 and the semiconductor device 120, and a part of the terminal 160 is exposed to the outside of the package housing 150.

At least one terminal 160 extends to be exposed to the outside of the package housing 150 for electrically connecting to the semiconductor device 120.

The clip structure 110 having an elastic structure may be bonded between the first substrate 130 and the second substrate 140 to function as a spacer and may be bent in a specific form to disperse or absorb the push-stress. Accordingly, the semiconductor device 120 may be protected from the outside impact.

Figure 6:
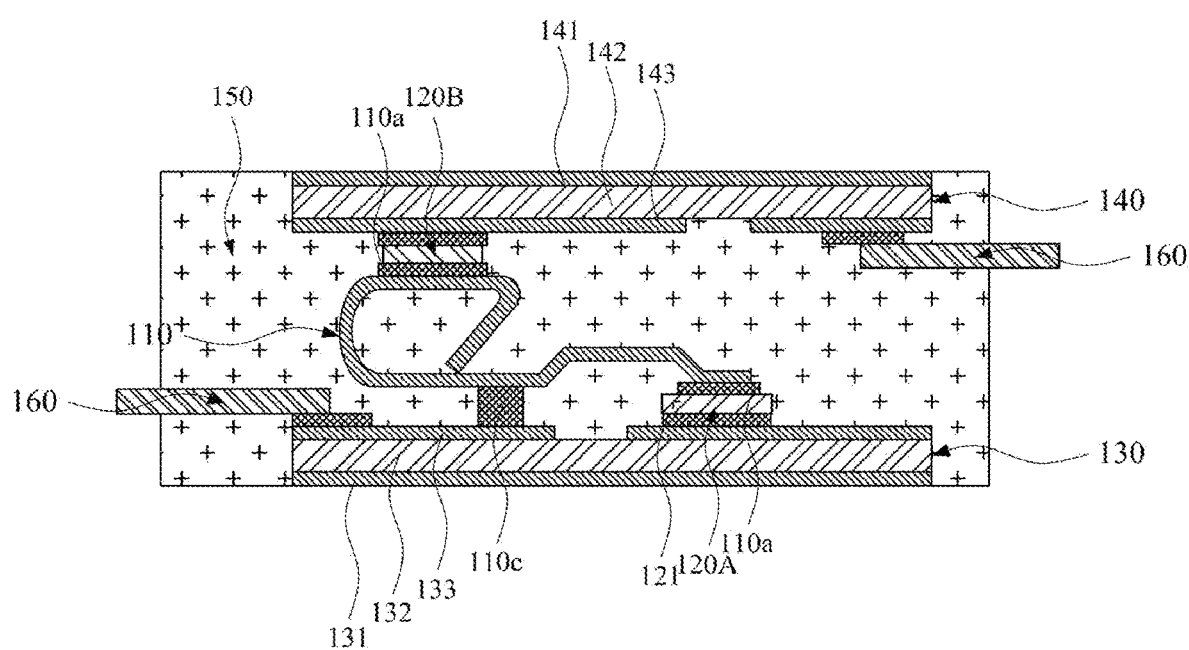
FIG. 6 is a cross-sectional view of a semiconductor package according to a third embodiment of the present invention.

Hereinafter, the semiconductor package according to the third embodiment of the present invention will be described in more detail with reference to FIG. 6.

Firstly, at least one first semiconductor device 120A is installed on the at least one first substrate 130.

Next, the at least one second substrate 140 is spaced apart from the first substrate 130 and includes at least one second semiconductor device 120B installed thereon.

The clip structure for a semiconductor package 110 is mentioned above, and as illustrated in FIGS. 2, 3, and 6, the clip structure 110 includes the first bonding unit 111 bonded to the terminal part of the upper surface or the lower surface of the first semiconductor device 120A by using the conductive adhesive 110*a* interposed therebetween, the main connecting unit 112 which is extended and bent from the first bonding unit 111, the second bonding unit 113 having the upper surface higher than the upper surface of the first bonding unit 111, the elastic unit 114 elastically connected between the main connecting unit 112 and one end of the second bonding unit 113, and the supporting unit 115 bent and extended from the other end of the second bonding unit 113 toward the main connecting unit 112, wherein the supporting unit 115 is formed to incline at an angle of 1° through 179° from the extended surface of the main connecting unit 112. Accordingly, the push-stress may be dispersed or absorbed and thereby, the impact which may be directly transmitted to the semiconductor device 120 may be relieved.

Here, the second bonding unit 113 of the clip structure 110 may be bonded to the terminal part of the upper surface or the lower surface of the second semiconductor device 120B by using the conductive adhesive 110*a* interposed therebetween.

A conductive connecting member (not illustrated) such as a bonding wire or a clip electrically connects the first semiconductor device 120A or the second semiconductor device 120B to the terminal 160 extended to the outside of the package housing 150 and thus, an electrical signal may be applied (refer to FIGS. 7 and 8).

The package housing 150 is formed of EMC, PBT, or PPS, insulates, and covers to protect an internal circuit, for example, the clip structure 110, the first semiconductor device 120A, and the second semiconductor device 120B, and a part of the terminal 160 is exposed to the outside of the package housing 150.

At least one terminal 160 extends to be exposed to the outside of the package housing 150 for electrically connecting to the first semiconductor device 120A or the second semiconductor device 120B.

The clip structure 110 having an elastic structure may be bonded between the first substrate 130 and the second substrate 140 to function as a spacer and may be bent in a specific form to disperse or absorb the push-stress. Accordingly, the first semiconductor device 120A and the second semiconductor device 120B may be protected from the outside impact.

Hereinafter, the semiconductor package according to the fourth embodiment of the present invention will be described in more detail with reference to FIGS. 7 and 8.

Firstly, at least one semiconductor device 120 is installed on the at least one substrate 130, wherein the substrate 130 may be a lower substrate having a specific metal pattern allowing electrical connection.

Next, the clip structure for a semiconductor package 110 is mentioned above, and as illustrated in FIGS. 2, 3, 7, and 8, the clip structure 110 includes the first bonding unit 111 bonded to the terminal part of the upper surface or the lower surface of the semiconductor device 120 by using the conductive adhesive 110*a* interposed therebetween, the main connecting unit 112 which is extended and bent from the first bonding unit 111, the second bonding unit 113 having the upper surface higher than the upper surface of the first bonding unit 111, the elastic unit 114 elastically connected between the main connecting unit 112 and one end of the second bonding unit 113, and the supporting unit 115 bent and extended from the other end of the second bonding unit 113 toward the main connecting unit 112, wherein the supporting unit 115 is formed to incline at an angle of 1° through 179° from the extended surface of the main connecting unit 112. Accordingly, the push-stress may be dispersed or absorbed and thereby, the impact which may be directly transmitted to the semiconductor device 120 may be relieved.

Here, at least a part of the upper surface of the second bonding unit 113 in the clip structure 110 is exposed to the surface of the package housing 150 so that heat generated while driving the semiconductor device 120 may be transmitted to the outside of the package housing 150 through the clip structure 110 and radiated.

Also, as illustrated in FIG. 7A, the main connecting unit 112 may be bonded to the substrate 130 by using the separate adhesive 110c and as illustrated in FIG. 7B, the main connecting unit 112 may be bonded to the substrate 130 by using the adhesive 110a formed on the upper surface of the other semiconductor device 120 on the substrate 130.

A conductive connecting member such as a bonding wire or a clip electrically connects the semiconductor device 120 to the terminal 160 extended to the outside of the package housing 150 and thus, an electrical signal may be applied.

The package housing 150 is formed of EMC, PBT, or PPS, insulates, and covers to protect an internal circuit, for example, the clip structure 110 and the semiconductor device 120, and a part of the terminal 160 is exposed to the outside of the package housing 150.

At least one terminal 160 extends to be exposed to the outside of the package housing 150 for electrically connecting to the semiconductor device 120.

The clip structure 110 having an elastic structure may be bent in a specific form to disperse or absorb the push-stress. Accordingly, the semiconductor device 120 may be protected from the outside impact and a part of the clip structure 110 is exposed to the surface of the package housing 150 so that heat may be radiated.

Commonly in the semiconductor packages of the second through fourth embodiments, the end of the supporting unit 115 and the main connecting unit 112 may be structurally contacted with each other as illustrated in FIG. 3A or may be spaced apart from each other by a distance d of 0.1 μm through 2 mm as illustrated in FIG. 3B.

Also, the clip structure 110 may be generally formed of a single material including Cu or Al or a composite material containing 50% or more of Cu or Al and may have a thickness of 0.1 mm through 2 mm. Accordingly, the clip structure 110 may have excellent ductility and malleability and thus, may effectively absorb the push-stress.

In addition, the elastic unit 114 may have a circular form between the main connecting unit 112 and the second bonding unit 113 and thereby, the push-stress may be effectively dispersed in a vertical direction.

The thickness of the clip structure 110 may be smaller than the thicknesses of the substrate 130 (fourth embodiment), the first substrate 130 (second embodiment and third embodiment), or the second substrate 140 (second embodiment and third embodiment).

The substrate 130, the first substrate 130, or the second substrate 140 may include at least one insulating layer including $Al_2O_3$ (ceramic) or AlN.

Also, the substrate 130, the first substrate 130, or the second substrate 140 may be formed of a single material including Cu or Al or a composite material containing 50% or more of Cu or Al. For example, as illustrated in FIG. 7B, the substrate 130 may be a metal substrate formed of a single material including Cu or Al or a composite material containing 50% or more of Cu or Al.

The terminal 160 may be bonded to the substrate 130, the first substrate 130 or the second substrate 140 by using a conductive adhesive or may be electrically connected to the substrate 130, the first substrate 130 or the second substrate 140 by ultrasonic welding.

Referring to FIG. 8, at least a part of the second bonding unit 113 exposed from the surface of the package housing 150 is bonded to a heat sink 172 through a heat transmitting unit 171 so that heat generated from the clip structure 110 to the heat sink 172 through the heat transmitting unit 171 may be effectively radiated to the outside of the package housing 150.

Here, the heat sink 172 may include a plurality of cooling fins and may cool the heat by air-cooling or water-cooling.

Also, the heat transmitting unit 171 may be a conductor having heat transfer rate of 0.1 w/mk through 15 w/m.

The substrate 130 (refer to FIGS. 7 and 8), a part of the first substrate 130 (refer to FIGS. 4 through 6), or the second substrate 140 (refer to FIGS. 4 through 6) are exposed from the surface of the package housing 150 and thus, heat may be radiated through the substrates exposed from the package housing 150.

The semiconductor packages described above may be used in driving an inverter, a converter, or an OBC which converts or controls power.

Figure 9:
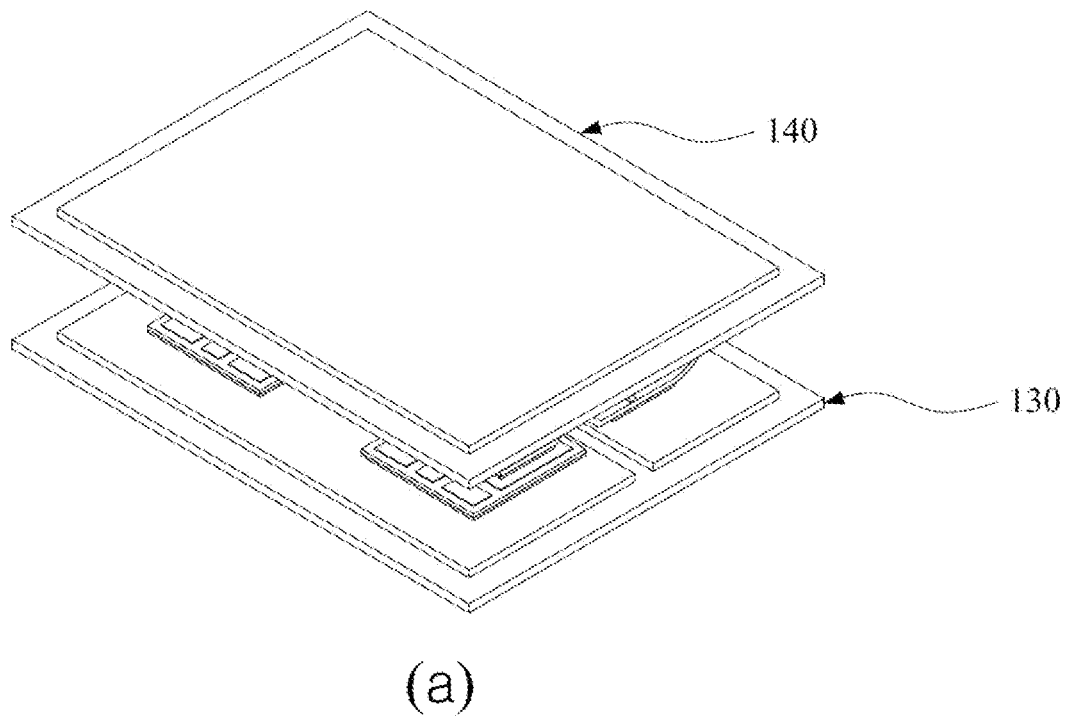
FIG. 9 is a perspective view of the semiconductor package according to the second embodiment of FIG. 4.
Figure 9:
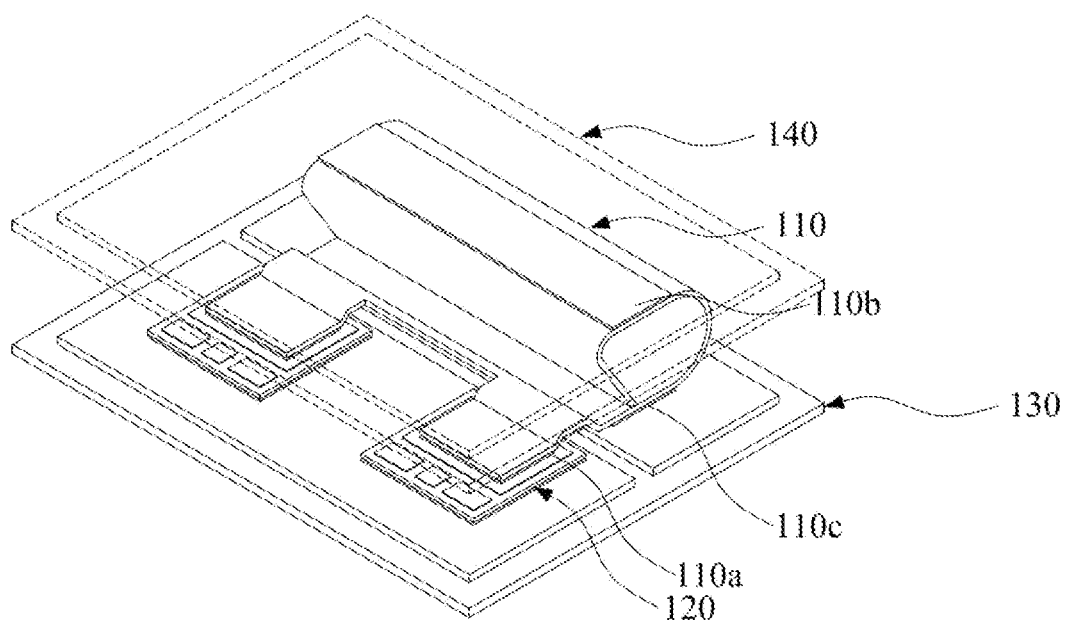
Figure 10:
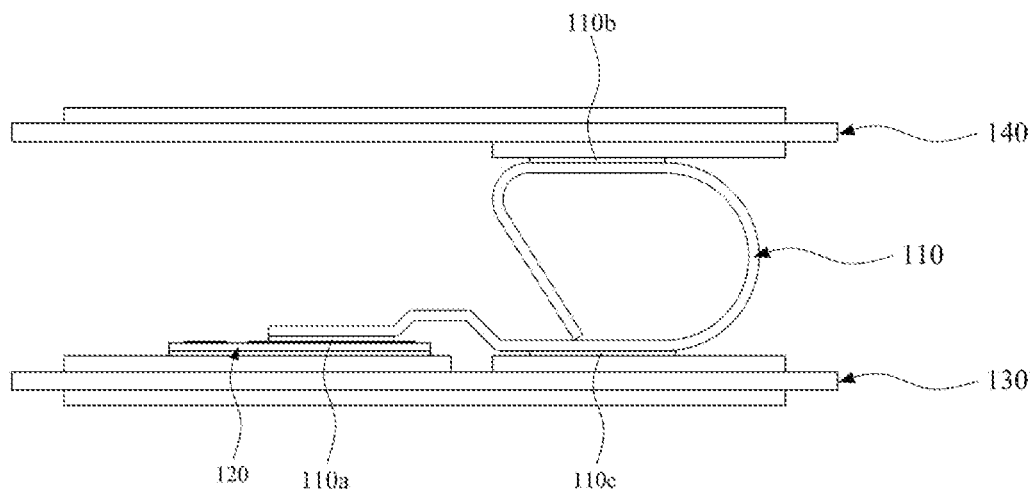
FIG. 10 is a side view and an exploded view of the semiconductor package of FIG. 9.
Figure 10:
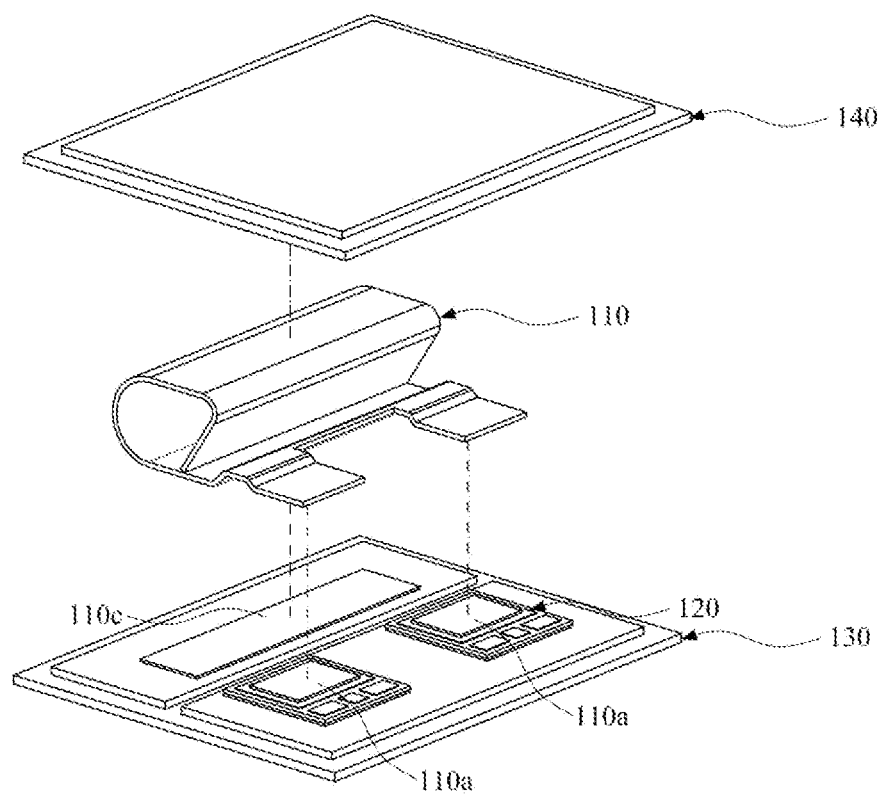
Figure 11:
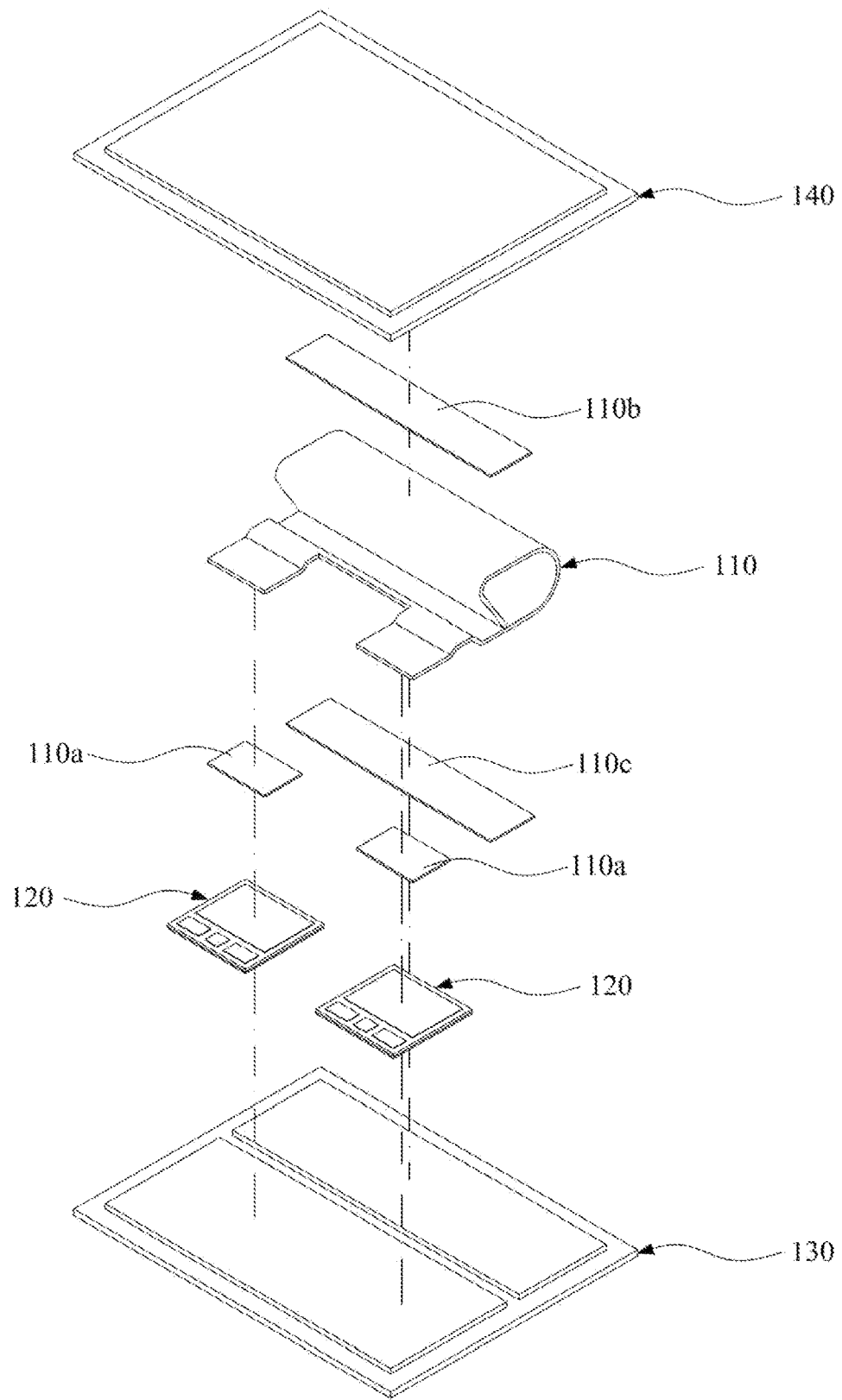
FIG. 11 is an exploded perspective view of the semiconductor package of FIG. 9.
Figure 12:
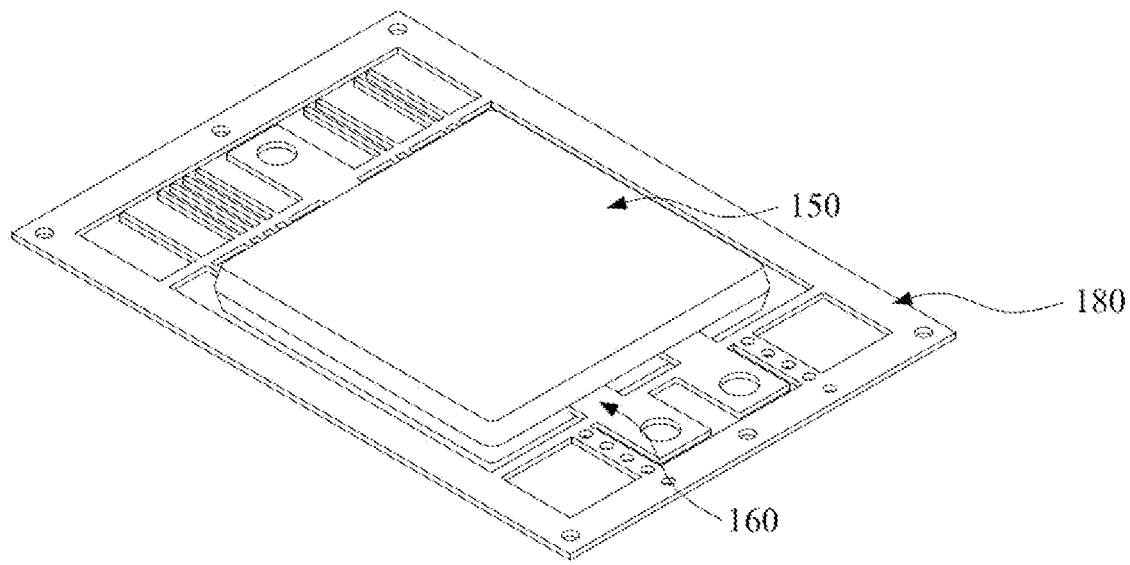
FIG. 12 illustrates a design of a product where the semiconductor package of FIG. 9 is applied.
Figure 12:
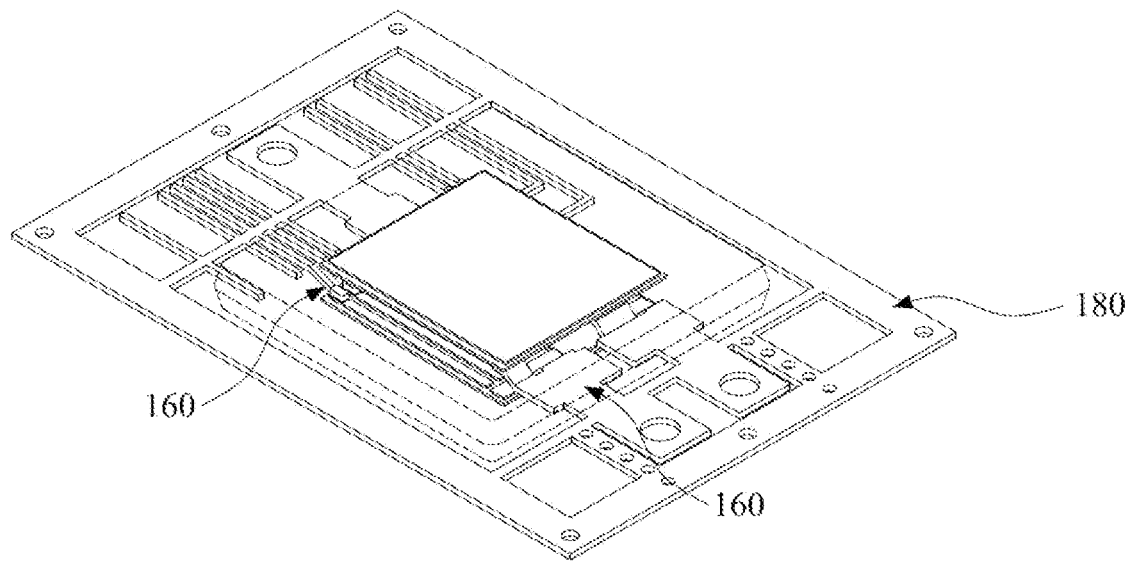
Figure 13:
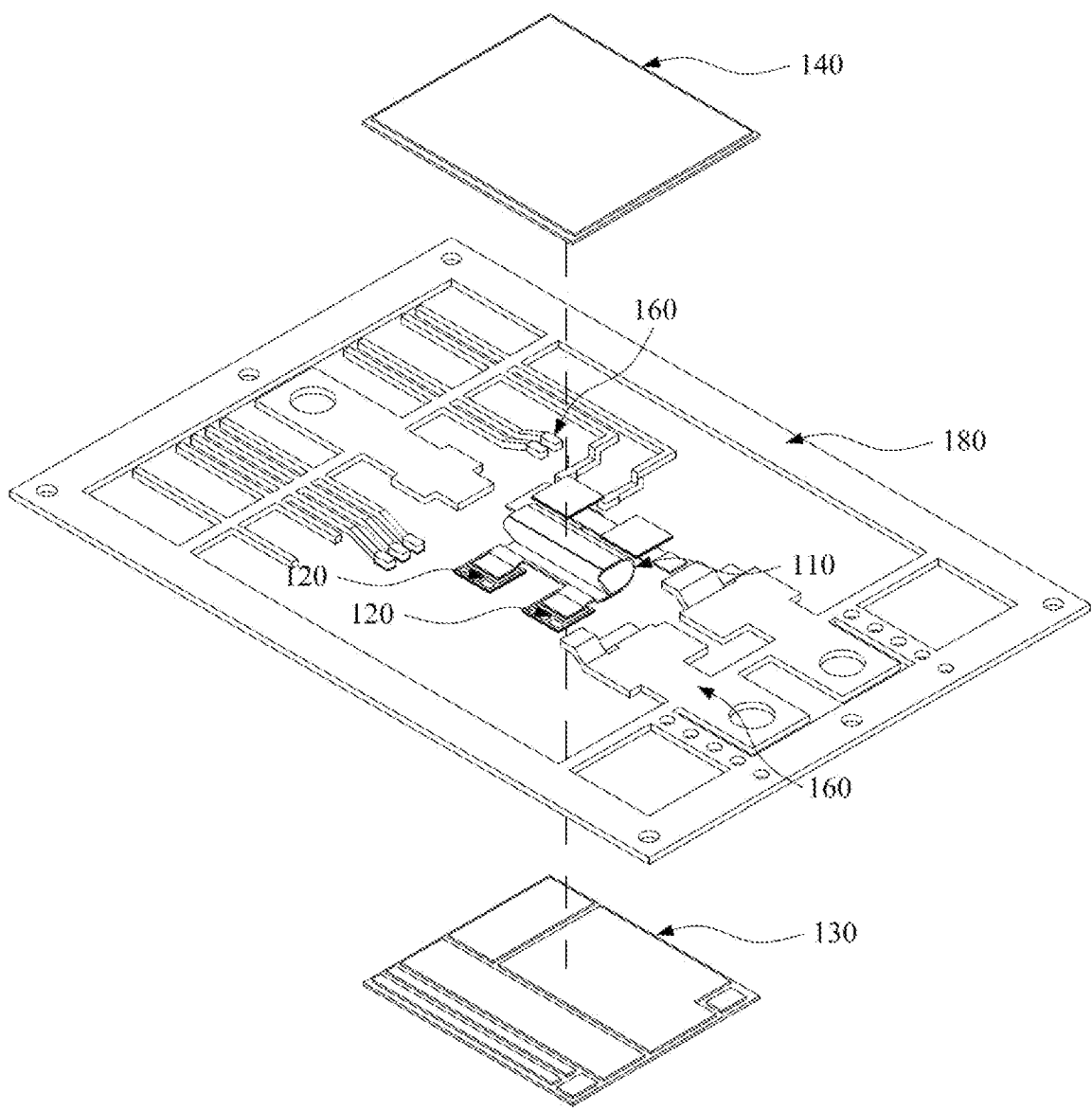
FIG. 13 is an exploded perspective view of the product of FIG. 12.

FIG. 9 is a perspective view of the semiconductor package according to the second embodiment of FIG. 4, FIG. 10 is a side view and an exploded view of the semiconductor package of FIG. 9, FIG. 11 is an exploded perspective view of the semiconductor package of FIG. 9, FIG. 12 illustrates a design of a product where the semiconductor package of FIG. 9 is applied, and FIG. 13 is an exploded perspective view of the product of FIG. 12.

Referring to the drawings above, the clip structure 110 having an elastic structure and a thickness of 0.2 mm is formed between the first and second substrates 130 and 140 each of which is formed of Zirconia Toughened Alumina (ZTA) having a thickness of 0.3 mm, instead of a general metal spacer having a vertical structure. The first bonding unit 111 is bonded to the semiconductor device 120 by using the conductive adhesive 110a formed of a Sn solder material, the main connecting unit 112 is bonded to the first substrate 130 by using the adhesive 110c formed of a Sn solder material, and the second bonding unit 113 is bonded to the second substrate 140 by using the conductive adhesive 110b formed of a SAC305 (Sn 96.5%, Ag 3.0%, Cu 0.5%) solder material. Accordingly, while molding, the push-stress applied between the first substrate 130 and second substrate 140 may not be directly transmitted to the semiconductor device 120.

FIGS. 12 and 13 illustrate a lead frame 180 where the terminal 160 electrically connected to the first substrate 130 or the second substrate 140 is patterned. In the semiconductor package described above, a part of the terminal 160 is extended and exposed. Then, molding is performed to form the package housing 150. Here, the lead frame 180 disposed outside of the package housing 150 is cut for commercialization.

According to the clip structure for the semiconductor package and the semiconductor package including the same described above, the clip structure, which is used instead of a high-priced metal spacer having a vertical structure formed of a material similar with a CTE of the semiconductor device so as to have price competitiveness, is bent having elasticity, and has a non-vertical structure, may disperse or absorb push-stress generated while molding so as to protect the semiconductor device and to effectively prevent a crack of an adhesive on a bonding area interposed between the semiconductor device and the clip structure, and may expose a part of the substrate or the clip structure to the outside of the package housing so as to improve heat radiation efficiency.

According to the present invention, the clip structure, which is used instead of a high-priced metal spacer having a vertical structure formed of a material similar with a CTE of the semiconductor device so as to have price competitiveness, is bent having elasticity, and has a non-vertical structure, may disperse or absorb push-stress generated while molding so as to protect the semiconductor device and to effectively prevent a crack of an adhesive on a bonding area interposed between the semiconductor device and the clip structure, and may expose a part of the substrate or the clip structure to the outside of the package housing so as to improve heat radiation efficiency. While the present invention has been particularly shown and described with reference to exemplary embodiments thereof, it will be understood by those of ordinary skill in the art that various changes in form and details may be made therein without departing from the spirit and scope of the present invention as defined by the following claims.

[Reference Signs and Numerals]

| | |
|---|---|
| 110: clip structure | 111: a first bonding unit |
| 112: a main connecting unit | 113: a second bonding unit |
| 114: an elastic unit | 115: a supporting unit |
| 120: a semiconductor device | 120A: a first semiconductor device |
| 120B: a second semiconductor device | 121: a conductive adhesive |
| 130: a substrate, a first substrate | 131: a metal layer |
| 132: a insulating layer | 133: a metal layer |
| 140: a second substrate | 141: a metal layer |
| 142: a insulating layer | 143: a metal layer |
| 150: a package housing | 160: a terminal |
| 171: a heat transmitting unit | 172: a heat sink |
| 180: a lead frame | |

What is claimed is:

1. A clip structure for a semiconductor package comprising:
    a first lower bonding unit configured to be bonded to a terminal part of an upper surface of a semiconductor device formed on a lower substrate;
    a first connecting unit folded upward extending from an end of the first lower bonding unit;
    a second connecting unit extending from an end of the first connecting unit in a horizontal direction;
    a third connecting unit folded downward extending from an end of the second connecting unit;
    a second lower bonding unit extending from an end of the third connecting unit in the horizontal direction and configured to be bonded to the lower substrate;
    an upper bonding unit provided above the second lower bonding unit and configured to be bonded to an upper substrate; and
    an elastic unit elastically connected between a first end of the upper bonding unit and an end of the second lower bonding unit, the elastic unit having an arch shape.

2. The clip structure for a semiconductor package of claim 1, further comprising a supporting unit folded downward extending from a second end of the upper bonding unit, wherein the supporting unit is formed to incline at an angle of 1° through 179° from the second lower bonding unit.

3. The clip structure for a semiconductor package of claim 2, wherein an end of the supporting unit is in contact with the second lower bonding unit.

4. The clip structure for a semiconductor package of claim 2, wherein an end of the supporting unit and the second lower bonding unit are spaced apart from each other by a vertical distance of 0.1 µm through 2 mm.

5. The clip structure for a semiconductor package of claim 1, wherein the clip structure is formed of a single material comprising Cu or Al or a composite material containing 50% or more of Cu or Al and has a thickness of 0.1 mm through 2 mm.

6. The clip structure for a semiconductor package of claim 1, wherein the elastic unit has a semi-circular shape.

7. A semiconductor package comprising:
    a lower substrate;
    an upper substrate spaced apart from the lower substrate;
    a semiconductor device formed on the lower substrate;
    a clip structure comprising:
        a first lower bonding unit bonded to an upper surface of the semiconductor device;
        a first connecting unit folded upward extending from an end of the first lower bonding unit;
        a second connecting unit extending from an end of the first connecting unit in a horizontal direction;
        a third connecting unit folded downward extending from an end of the second connecting unit;
        a second lower bonding unit extending from an end of the third connecting unit in the horizontal direction and bonded to the lower substrate;
        an upper bonding unit provided above the second lower bonding unit and bonded to the upper substrate; and
        an elastic unit elastically connected between a first end of the upper bonding unit and an end of the second lower bonding unit, the elastic unit having an arch shape;
    a package housing covering the semiconductor device; and
    a terminal exposed to an outside of the package housing for electrically connecting to the semiconductor device.

8. A semiconductor package comprising:
    a lower substrate on which a first semiconductor device is formed;
    an upper substrate spaced apart from the lower substrate, wherein a second semiconductor device is formed on the upper substrate;
    a clip structure comprising:
        a first lower bonding unit bonded to an upper surface of the first semiconductor device;
        a first connecting unit folded upward extending from an end of the first lower bonding unit;
        a second connecting unit extending from an end of the first connecting unit in a horizontal direction;
        a third connecting unit folded downward extending from an end of the second connecting unit;
        a second lower bonding unit extending from an end of the third connecting unit in the horizontal direction and bonded to the lower substrate;
        an upper bonding unit provided above the second lower bonding unit and bonded to a lower surface of the second semiconductor device; and
        an elastic unit elastically connected between a first end of the upper bonding unit and an end of the second lower bonding unit, the elastic unit having an arch shape;
    a package housing covering the first semiconductor device and the second semiconductor device; and a terminal exposed to an outside of the package housing for electrically connecting to the first semiconductor device or the second semiconductor device.

9. A semiconductor package comprising:
a lower substrate;
a semiconductor device formed on the lower substrate;
a clip structure comprising:
   a first lower bonding unit bonded to an upper surface of the semiconductor device;
   a first connecting unit folded upward and extending from an end of the first lower bonding unit;
   a second connecting unit extending from an end of the first connecting unit in a horizontal direction;
   a third connecting unit folded downward extending from an end of the second connecting unit;
   a second lower bonding unit extending from an end of the third connecting unit in the horizontal direction and bonded to the lower substrate;
   an upper bonding unit provided above the second lower bonding unit; and
   an elastic unit elastically connected between a first end of the upper bonding unit and an end of the second lower bonding unit, the elastic unit having an arch shape;
a package housing covering the semiconductor device; and
a terminal exposed to an outside of the package housing for electrically connecting to the semiconductor device,
wherein at least a part of an upper surface of the upper bonding unit in the clip structure is not covered with the package housing.

10. The semiconductor package of claim 7, wherein the clip structure further comprises a supporting unit folded downward extending from a second end of the upper bonding unit, wherein the supporting unit is formed to incline at an angle of 1° through 179° from the second lower bonding unit.

11. The semiconductor package of claim 10, wherein an end of the supporting unit is in contact with the second lower bonding unit.

12. The semiconductor package of claim 10, wherein an end of the supporting unit and the second lower bonding unit are spaced apart from each other by a vertical distance of 0.1 µm through 2 mm.

13. The semiconductor package of claim 7, wherein the clip structure is formed of a single material comprising Cu or Al or a composite material containing 50% or more of Cu or Al and has a thickness of 0.1 mm through 2 mm.

14. The semiconductor package of claim 7, wherein the elastic unit has a semi-circular shape.

15. The semiconductor package of claim 7, wherein a thickness of the clip structure is less than a thickness of the lower substrate or the upper substrate.

16. The semiconductor package of claim 7, wherein the lower substrate or the upper substrate comprises at least one insulating layer.

17. The semiconductor package of claim 7, wherein the lower substrate or the upper substrate is formed of a single material comprising Cu or Al or a composite material containing 50% or more of Cu or Al.

18. The semiconductor package of claim 7, wherein a part of the lower substrate or the upper substrate is not covered with the package housing.

19. The semiconductor package of claim 9, wherein the upper surface of the upper bonding unit is bonded to a heat sink through a heat transmitting unit.

20. A semiconductor package comprising the semiconductor package of claim 7 used in driving any one of an inverter, a converter, and an On Board Charger (OBC).

* * * * *